(12) United States Patent
Chen

(10) Patent No.: US 10,522,926 B2
(45) Date of Patent: Dec. 31, 2019

(54) ASSEMBLY OF PRINTED CIRCUIT BOARD AND CARD EDGE CONNECTOR FOR MEMORY MODULE CARD

(71) Applicant: Sung-Yu Chen, Hsinchu (TW)

(72) Inventor: Sung-Yu Chen, Hsinchu (TW)

( * ) Notice: Subject to any disclaimer, the term of this patent is extended or adjusted under 35 U.S.C. 154(b) by 0 days.

(21) Appl. No.: 16/405,962

(22) Filed: May 7, 2019

(65) Prior Publication Data

US 2019/0348783 A1 Nov. 14, 2019

(30) Foreign Application Priority Data

May 9, 2018 (CN) .......................... 2018 1 0439525

(51) Int. Cl.
| | | |
|---|---|---|
| *H01R 13/62* | (2006.01) | |
| *H01R 12/73* | (2011.01) | |
| *H01R 13/645* | (2006.01) | |
| *H01R 13/40* | (2006.01) | |
| *H01R 12/58* | (2011.01) | |
| *H05K 1/16* | (2006.01) | |
| *H05K 1/11* | (2006.01) | |
| *H01R 13/6471* | (2011.01) | |
| *H05K 1/02* | (2006.01) | |

(52) U.S. Cl.
CPC .......... *H01R 12/737* (2013.01); *H01R 12/58* (2013.01); *H01R 13/40* (2013.01); *H01R 13/6456* (2013.01); *H01R 13/6471* (2013.01); *H05K 1/115* (2013.01); *H05K 1/165* (2013.01); *H05K 1/0237* (2013.01); *H05K 2201/09263* (2013.01); *H05K 2201/1034* (2013.01)

(58) Field of Classification Search
CPC .............. H01R 23/682; H01R 23/7005; H01R 23/7068; H01R 13/633; H01R 13/62938; H01R 13/635
USPC ................ 439/326, 327, 328, 160, 157, 153
See application file for complete search history.

(56) References Cited

U.S. PATENT DOCUMENTS

| | | | | |
|---|---|---|---|---|
| 8,747,133 | B2 * | 6/2014 | Shen | H01R 12/7005 439/157 |
| 8,771,001 | B2 * | 7/2014 | Li | H01R 13/639 439/160 |
| 8,900,001 | B2 * | 12/2014 | Li | H01R 12/7005 439/157 |
| 10,136,544 | B2 * | 11/2018 | Norton | H05K 7/1431 |
| 10,461,467 | B2 * | 10/2019 | Eppley | H01R 13/6275 |

* cited by examiner

*Primary Examiner* — Phuong Chi Thi Nguyen
(74) *Attorney, Agent, or Firm* — Li & Cai Intellectual Property Office

(57) ABSTRACT

An assembly of a printed circuit board and a card edge connector for interconnecting a memory module card is provided. The assembly includes a card edge connector and a printed circuit board for receiving the card edge connector. The card edge connector has an insulated housing and a plurality of terminals that are divided into an upper-row terminal group and a lower-row terminal group. The insulated housing has an elongated slot formed along a longitudinal direction. Each terminal group includes a first terminal, a second terminal and a third terminal. The printed circuit board has grounding via holes and plated through holes which are formed at two sides of the orthographic projection of the elongated slot. The high-frequency signal holes are separated by grounding traces or the grounding via holes, so as to provide good shielding effect for avoiding cross-talk interference.

12 Claims, 10 Drawing Sheets

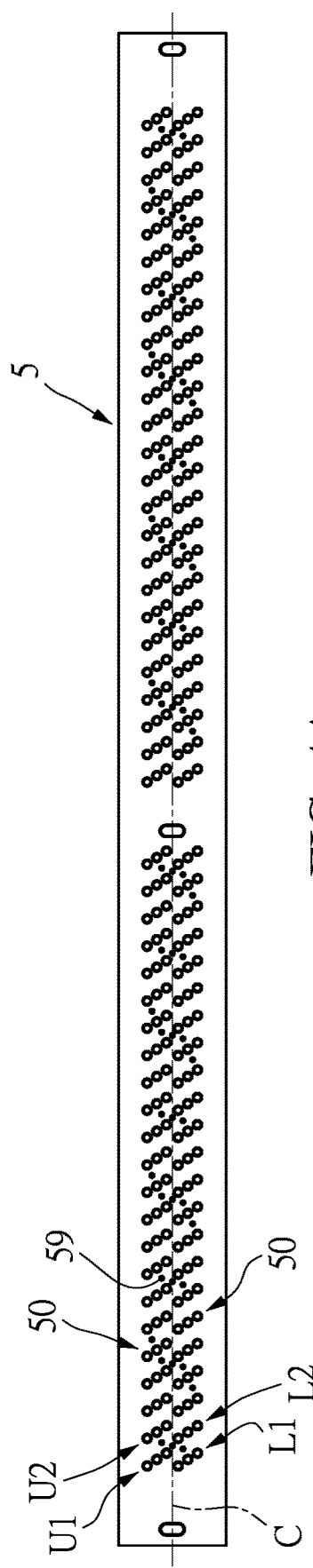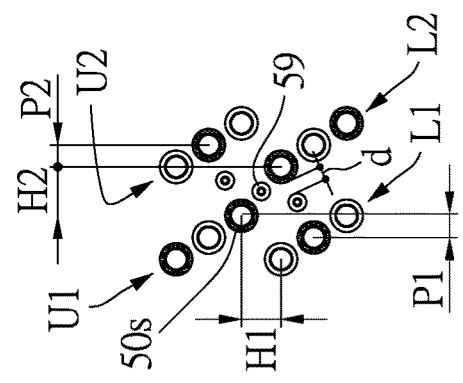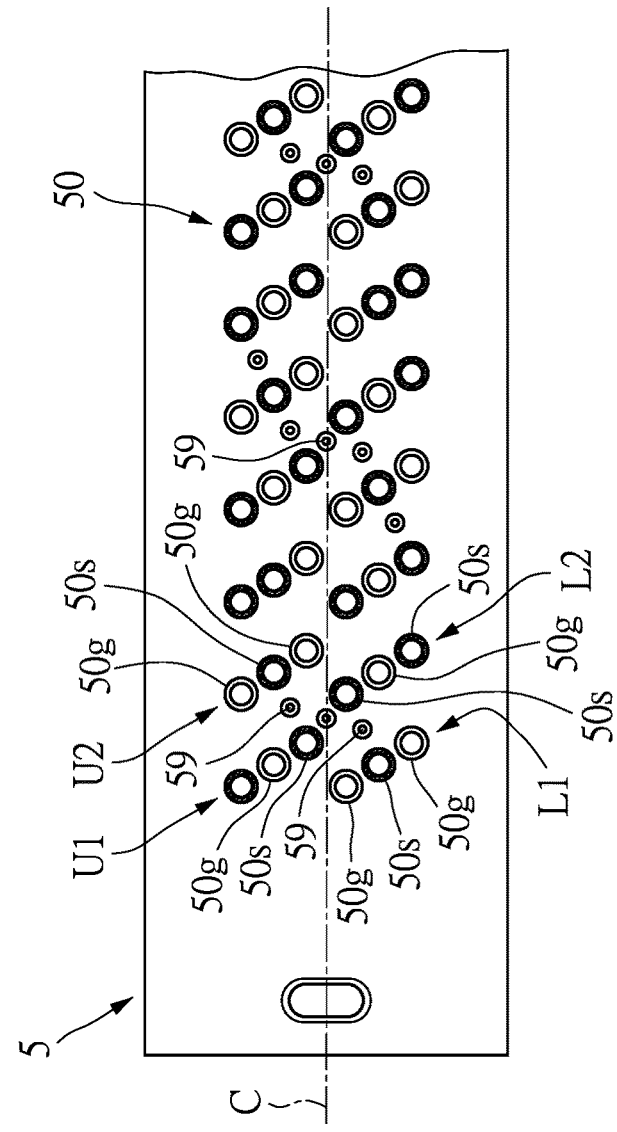
FIG. 4A
FIG. 4B
FIG. 4C

ASSEMBLY OF PRINTED CIRCUIT BOARD AND CARD EDGE CONNECTOR FOR MEMORY MODULE CARD

CROSS-REFERENCE TO RELATED PATENT APPLICATION

This application claims the benefit of priority to China Patent Application No. 201810439525.3, filed on May 9, 2018 in the People's Republic of China. The entire content of the above-identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an assembly of a printed circuit board and a card edge connector for interconnecting a memory module card, and more particularly to a DIMM (Dual In-line Memory Module) card edge connector with through-hole technique (THT) pins and a compatible printed circuit board.

BACKGROUND OF THE DISCLOSURE

Most computer servers, laptop computers, notebook computers, tablet PCs and mobile phones today are applied with various Dual In-line Memory Modules (DIMM), and advancements in relevant technology have been swift. To avoid shortening the life cycle of the terminal products with the above-mentioned DIMM applications and an excessive change of relevant design philosophies, associations responsible for establishing relevant standards usually opt to maintain existing specifications of physical dimensions in order to promote accelerated progress in the industry. However, such a philosophy for innovation causes the development of related components to be difficult. For example, the single channel transmission frequency of a conventional fourth generation of DIMM memory module card has reached 25.6 GB/s, but the single channel transmission frequency of a next generation of DIMM memory module card is estimated to reach 51.2 GB/s with the same physical dimensions.

A conventional DIMM (Dual In-line Memory Module) card edge connector with through-hole technique (THT) pins cannot achieve a corresponding high-frequency performance in a next generation of the double data rate (DDR) transferring data memory module card while maintaining the same physical dimensions. Therefore, relevant developments have trended toward surface mounting technology (SMT) connectors. However, with the large physical dimensions of the original structure, coplanarity would be an issue that is hard to break through, making mass production difficult.

SUMMARY OF THE DISCLOSURE

In response to the above-referenced technical inadequacies, the present disclosure provides an assembly of a printed circuit board (PCB) and a card edge connector for a memory module card. Under the same physical dimension and the same pitches of contacting portions of terminals, the pitch between the soldering portions of high-frequency signal terminals is larger than the pitch between the soldering portions of high-frequency signal terminals and the soldering portion of ground terminals. Thus, the near end crosstalk of high-frequency signals is lower than −25 dB under a transmission frequency within a range of 0 GHz to 5 GHz, and the single channel transmission bandwidth can reach 51.2 GB/s, so as to provide a better shielding effect for the high-frequency signal transmission and enhance the capacity of channel transmission.

In one aspect, the present disclosure provides an assembly of a PCB and a card edge connector for a memory module card plugged therein, which includes a card edge connector and a PCB. The card edge connector includes an insulated housing and a plurality of terminals. The insulated housing has an elongated slot formed along a longitudinal direction, and a key portion. The key portion is arranged in the elongated slot, so as to divide the elongated slot into a first slot and a second slot. The insulated housing is formed with a plurality of terminal slots, and the terminal slots are respectively located at two sides of the elongated slot and perpendicular to the longitudinal direction. The terminals are correspondingly received in the terminal slots. The terminals are divided into an upper-row terminal group and a lower-row terminal group. The upper-row terminal group is received in the terminal slots arranged at one side of the longitudinal direction, and the lower-row terminal group is received in the terminal slots arranged at the other side of the longitudinal direction. The upper-row terminal group and the lower-row terminal group respectively include a first terminal, a second terminal, and a third terminal. Each terminal has a contacting portion, a soldering portion and a linking portion. The linking portion interconnects the contacting portion and the soldering portion. The linking portion of the first terminal extends toward a direction perpendicular to the longitudinal direction and is bent toward the same direction. The linking portion of the third terminal is bent toward a direction opposite to the bending direction of the linking portion of the first terminal. The linking portion of the second terminal is disposed adjacent to and between the linking portion of the first terminal and the linking portion of the third terminal. A distance between the contacting portion of the first terminal and the contacting portion of the second terminal is equal to a distance between the contacting portion of the second terminal and the contacting portion of the third terminal, and the distance is larger than a distance between the soldering portion of the first terminal and the soldering portion of the second terminal, and is larger than a distance between the soldering portion of the second terminal and the soldering portion of the third terminal. The printed circuit board includes a plurality of plated through holes and a plurality of grounding via holes. The plated through holes are respectively located at two sides of an orthographic projection of the elongated slot. The plated through holes are arranged into a plurality of upper rows on one side and a plurality of lower rows on the other side. The upper rows and the lower rows are parallel to each other and oblique to the longitudinal direction of the printed circuit board. The plated through holes include a plurality of ground signal holes and a plurality of high-frequency signal holes, which are configured as follows:

the ground signal hole of a first upper row correspondingly matched with the second terminal of the upper-row terminal group;

the high-frequency signal hole of the first upper row and close to an orthographic projection of the elongated slot correspondingly matched with the third terminal of the upper-row terminal group, and being adjacent to the ground signal hole of the first upper row;

a first one of the ground signal holes of a second upper row correspondingly matched with the first terminal of the upper-row terminal group, and being adjacent to the high-frequency signal holes of the first upper row;

the high-frequency signal hole of the second upper row correspondingly matched with the second terminal of the upper-row terminal group, and being close to the first one of the ground signal holes of the second upper row;

a second one of the ground signal holes of the second upper row adjacent to the orthographic projection of the elongated slot correspondingly matched with the third terminal of the upper-row terminal group, and close to the high-frequency signal hole of the second upper row; and a first one of the ground signal holes of a first lower row adjacent to the orthographic projection of the elongated slot correspondingly matched with the first terminal of the lower-row terminal group.

The high-frequency signal hole of the first lower row is correspondingly matched with the second terminal of the lower-row terminal group, and is adjacent to a first one of the ground signal holes of the first lower row. The ground signal hole of a second lower row is correspondingly matched with the second terminal of the lower-row terminal group, and is close to the high-frequency signal hole of the first lower row. A second one of the ground signal holes of the first lower row adjacent to an outer side of the printed circuit board is correspondingly matched with the third terminal of the lower-row terminal group. The high-frequency signal hole of the second lower row adjacent to the orthographic projection of the elongated slot is correspondingly matched with the first terminal of the lower-row terminal group, and adjacent to the second one of the ground signal holes of the first lower row. The ground signal hole of the second lower row is correspondingly matched with the second terminal of the lower-row terminal group, and is close to the high-frequency signal hole of the second lower row. The high-frequency signal hole of the first upper row, the high-frequency signal hole of the second upper row, and the high-frequency signal hole of the second lower row are separated by one of the grounding via holes; wherein the high-frequency signal hole of the first lower row and the high-frequency signal hole of the second lower row are separated by one of the grounding via holes.

Therefore, the present disclosure has advantages and functions as follows. The soldering portions of the terminals in the same group of the card edge connector are extended to be near the second terminal. When the second terminal is used to transmit ground signals, it can provide a better shielding effect for the high-frequency signal transmission. The high-frequency signal holes are isolated by ground traces or the grounding via holes, such that they can provide good shielding for avoiding cross-talk interference. Further, the configuration of the card edge connector can allow for the increase of more high-frequency signal terminals, so as to adapt to a new memory module card of the next generation. The printed circuit board, on which the card edge connector is mounted, is also configured correspondingly, so that the dual in-line packaged connector of the present disclosure can be mass-produced, with a performance capable of matching with the DDR memory module card of the next generation.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

FIG. 4A is a top view of the printed circuit board of the present disclosure.

FIG. 4B is a partially enlarged top view of the printed circuit board of the present disclosure.

FIG. 4C is a partially enlarged top view of plated through holes of the printed circuit board of the present disclosure.

DETAILED DESCRIPTION OF THE EXEMPLARY EMBODIMENTS

Figure 1:
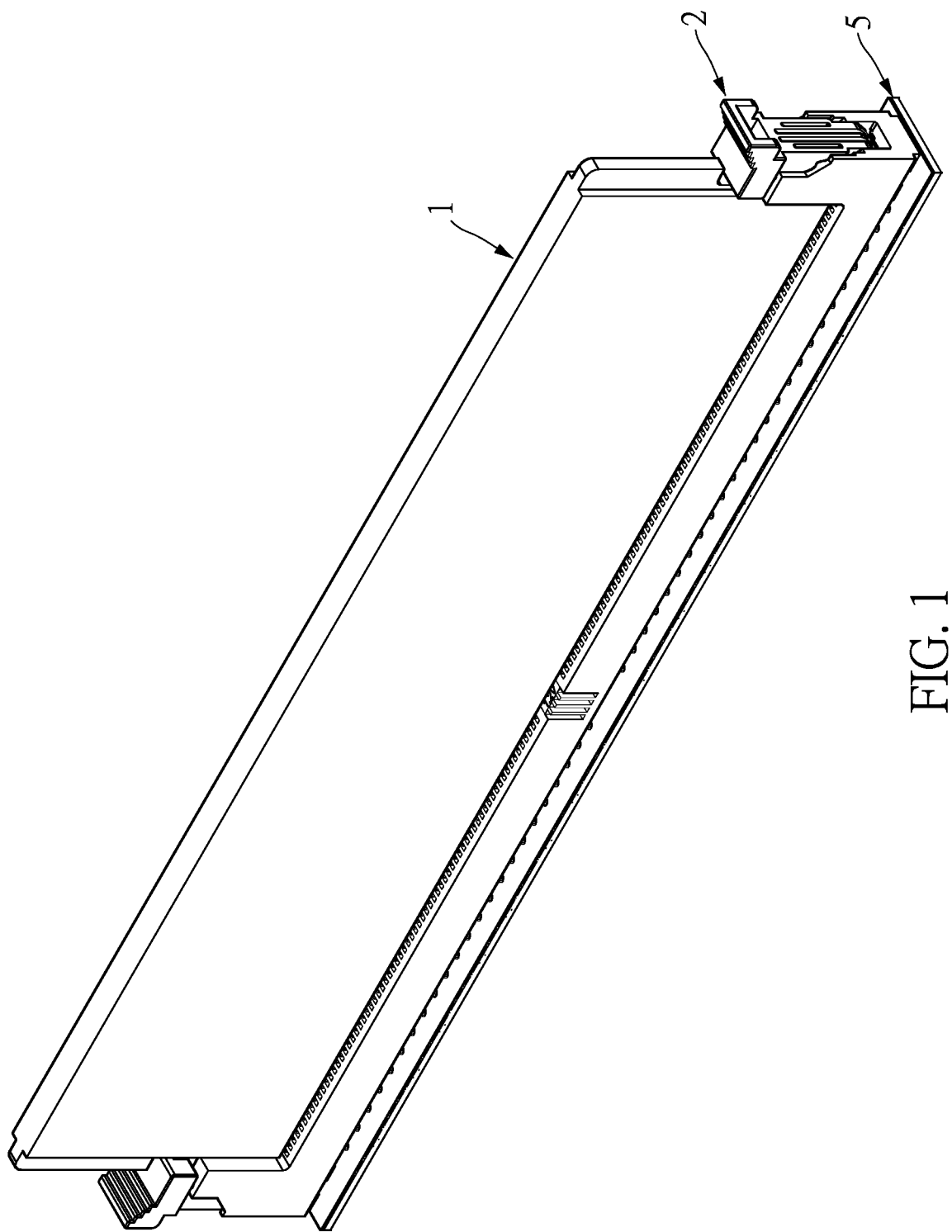
FIG. 1 is an assembled perspective view of a card edge connector, a printed circuit board and a memory module card of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 2A:
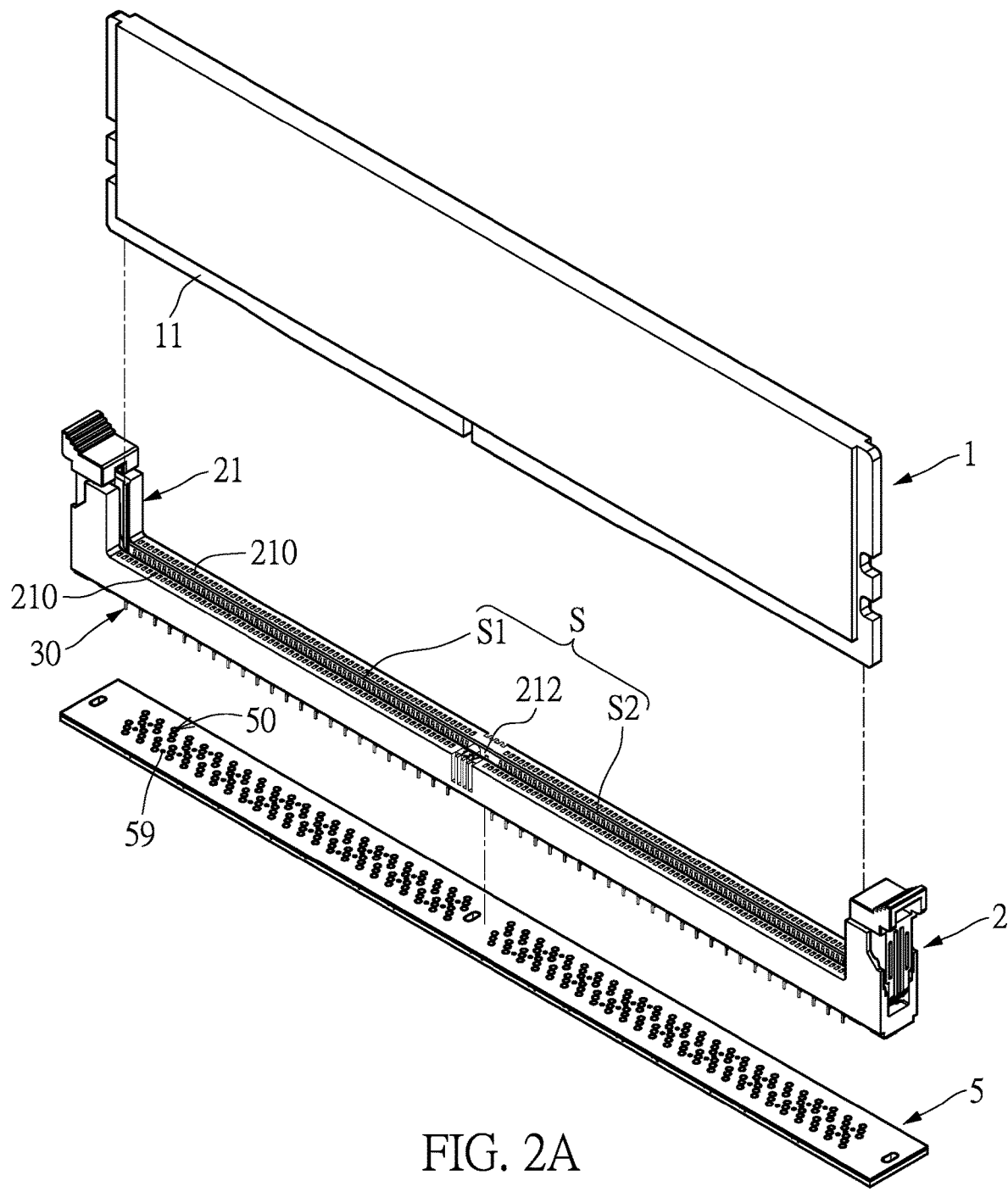
FIG. 2A is an exploded perspective view of the card edge connector, the printed circuit board and the memory module card of the present disclosure.
Figure 2B:
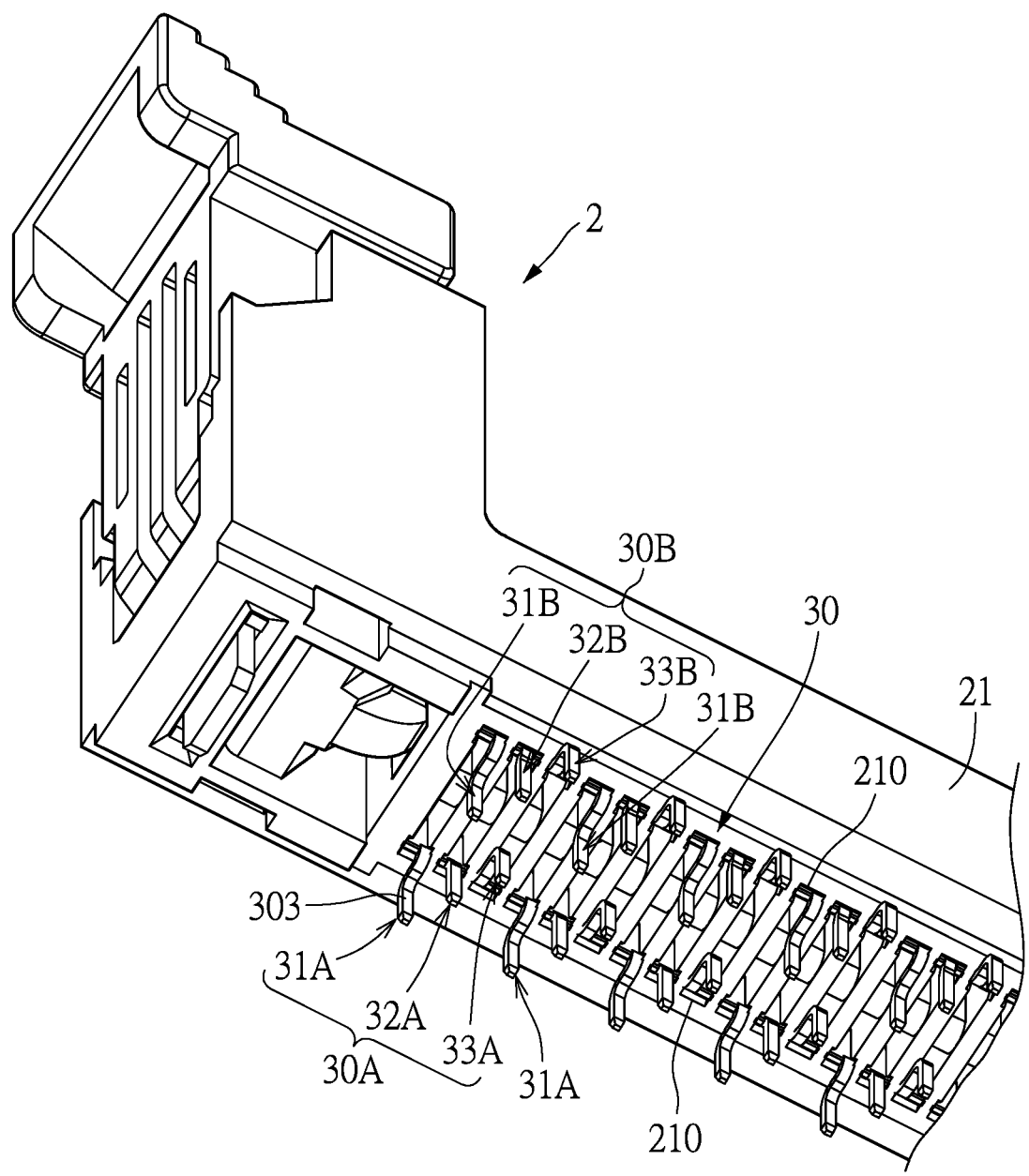
FIG. 2B is a perspective partial view of the card edge connector of the present disclosure.

Referring to FIG. 1 to FIG. 2B, a practical embodiment of the present disclosure provides a card edge connector 2 for interconnecting a daughter card (i.e., memory module card) 1 and a motherboard (i.e. printed circuit card) 5 for the card edge connector 2 mounted thereon.

The card edge connector 2 of the present disclosure includes an insulated housing 21 and a plurality of terminals 30. The insulated housing 21 has an elongated slot S which is formed along a longitudinal direction, and a key portion 212. The key portion 212 is arranged in the elongated slot S, so as to divide the elongated slot S into a first slot S1 and a second slot S2. The insulated housing 21 is formed with a plurality of terminal slots 210. The terminal slots 210 are respectively located at two sides of the elongated slot S and perpendicular to the longitudinal direction.

As seen in FIG. 2B, the terminals 30 are received in the terminal slots 210, respectively, and are divided into an upper-row terminal group 30A and a lower-row terminal group 30B. The upper-row terminal group 30A is received in the terminal slots 210 arranged at one side of the longitudinal direction, that is the upper side as shown in FIG. 2A. The lower-row terminal group 30B is received in the terminal slots 210 arranged at the other side of the longitudinal direction, that is, the lower side as shown in FIG. 2A. The upper-row terminal group 30A and the lower-row terminal group 30B at least includes a first terminal (31A, 31B), a second terminal (32A, 32B) and a third terminal (33A, 33B), respectively. As shown in FIG. 3A to FIG. 3D, each of the terminals 30 has a contacting portion 301, a soldering portion 303 and a linking portion 302. The linking portion 302 interconnects the contacting portion 301 and the soldering portion 303.

Reference is made to FIG. 2A and FIG. 2B. When the memory module card 1 is inserted into the card edge connector 2, the contacting portion 301 electrically connects golden fingers 11 of the memory module card 1. When the card edge connector 2 is mounted on the printed circuit board 5, the soldering portions 303 are inserted correspondingly into the plated through holes 50 of the printed circuit board 5.

Figure 3A:
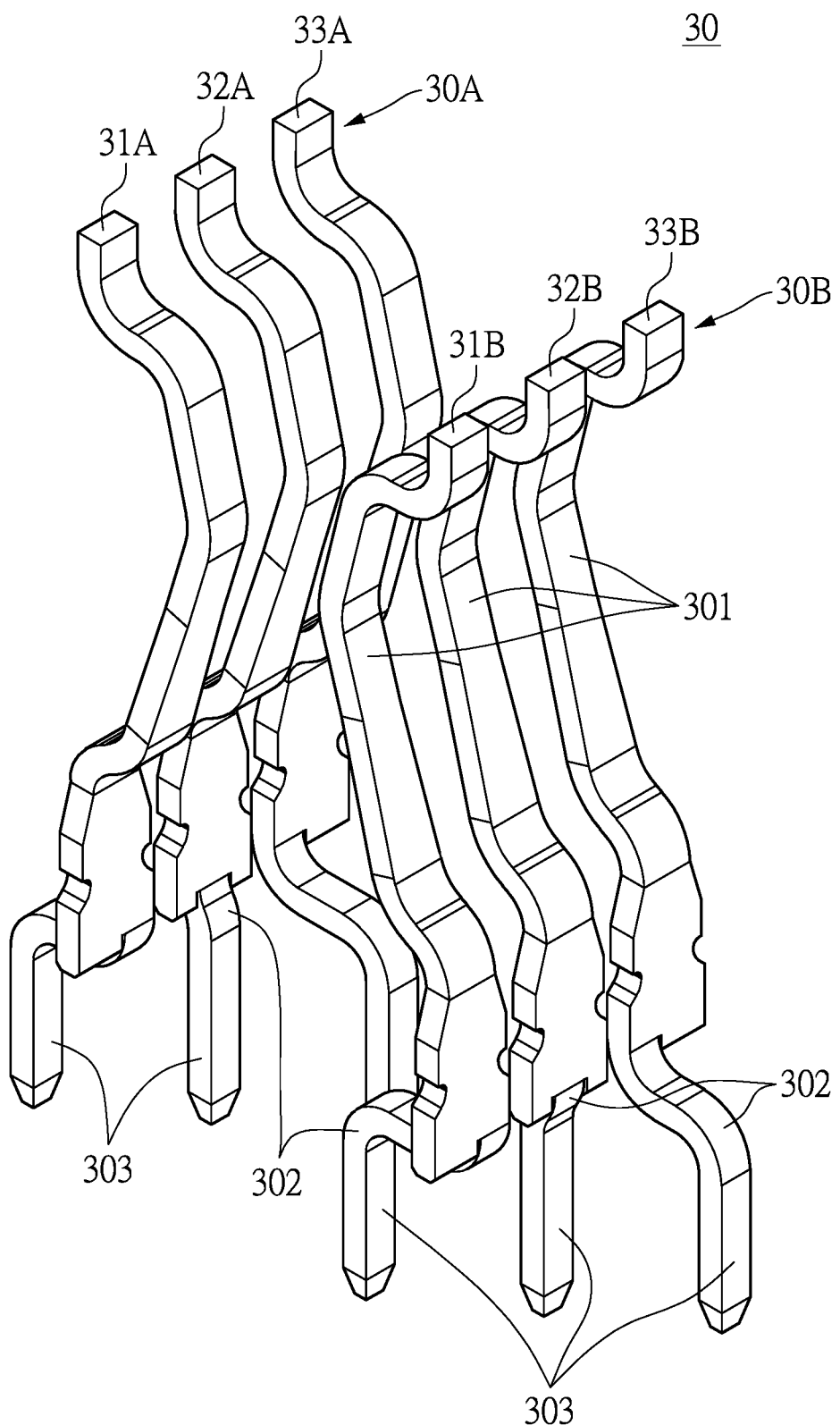
FIG. 3A is a perspective view of a terminal group of the present disclosure.
Figure 3C:
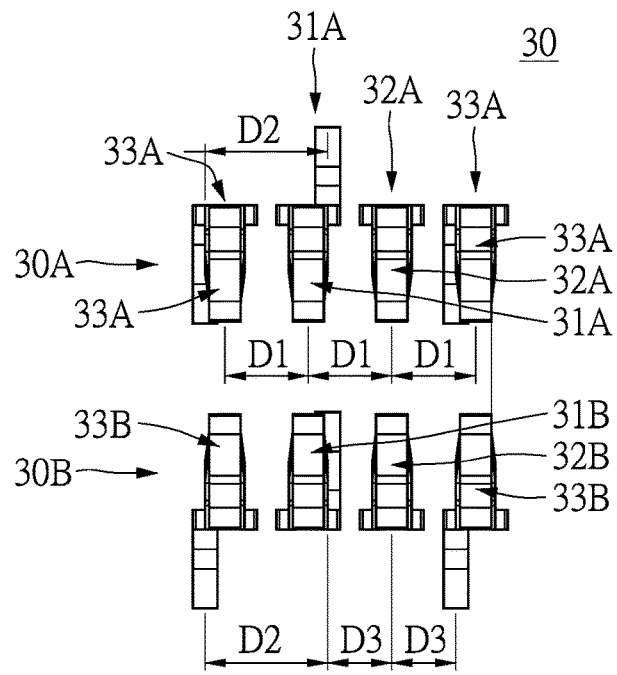
FIG. 3C is a top view of the terminal group of the present disclosure.
Figure 3B:
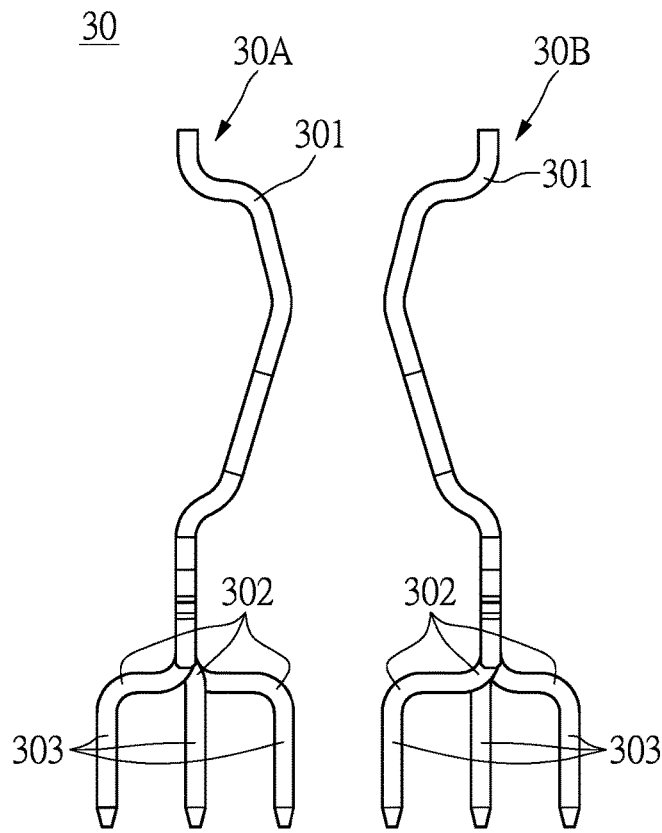
FIG. 3B is a side view of the terminal group of the present disclosure.

As shown in FIG. 3A to FIG. 3B, the linking portions 302 of the first terminals 31A, 31B are bent toward the same direction that is perpendicular to the longitudinal direction. For a further explanation, the first terminal 31A of the upper-row terminal group 30A is bent toward a direction away from the elongated slot S, and the first terminal 31B of the lower-row terminal group 30B is bent toward the elongated slot S. The linking portions 302 of the third terminals 33A, 33B are bent toward the same direction opposite to that of the linking portions 302 of the first terminals 31A, 31B.

A radius of the linking portion 302 of the second terminal (32A, 32B) is smaller than a radius of the linking portion 302 of the first terminal (31A, 31B), and is also smaller than a radius of the linking portion 302 of the third terminal (33A, 33B). The linking portions 302 of the second terminal (32A, 32B) are disposed close to each other between the first terminal (31A, 31B) and the third terminal (33A, 33B).

Figure 3D:
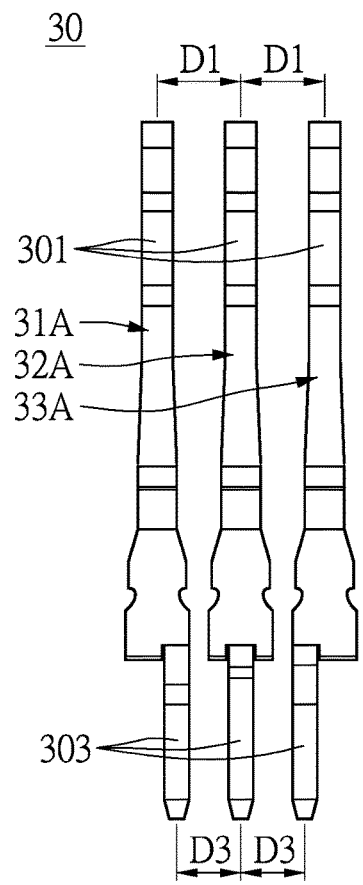
FIG. 3D is a front view of the terminal group of the present disclosure.

As shown in FIG. 3C and FIG. 3D, a distance D1 between the contacting portion 301 of the first terminal (31A, or 31B) and the contacting portion 301 of the second terminal (32A, or 32B) is equal to a distance D1 between the contacting portion 301 of the second terminal (32A, or 32B) and the contacting portion 301 of the third terminal (33A, or 33B). Further, the distance D1 is larger than a distance D3 between the soldering portion 303 of the first terminal (31A, or 31B) and the soldering portion 303 of the second terminal (32A, or 32B), and also larger than a distance D3 between the soldering portion 303 of the second terminal (32A, or 32B) and the soldering portion 303 of the third terminal (33A, or 33B). In other words, the present disclosure arranges three of the terminals 30, being the first terminal, the second terminal, and the third terminal, as one unit. The three soldering portions 303 are arranged to close to each other, so as to reduce the occupied space and area. The soldering portion 303 and the contacting portion 301 of the second terminal (32A, or 32B) are arranged on the same line. The soldering portion 303 and the contacting portion 301 of the first terminal (31A, or 31B) are staggered and not on the same line, and the soldering portion 303 is arranged close to the second terminal (32A, 32B). The soldering portion 303 of the third terminal (33A, 33B) and the contacting portion 301 are staggered and not on the same line, and the soldering portion 303 is arranged close to the second terminal (32A, 32B).

Reference is made to FIG. 3A and FIG. 3D. A profile of the first terminal 31A of the upper-row terminal group 30A is the same as a profile of the third terminal 33B of the lower-row terminal group 30B, and are disposed diagonally opposite to each other. A profile of the third terminal 33A of the upper-row terminal group 30A is the same as a profile of the first terminal 31B of the lower-row terminal group 30B, and are disposed diagonally opposite to each other.

Referring to FIG. 3C and FIG. 3D, in the upper-row terminal group 30A (or the lower-row terminal group 30B), a distance D2 between the soldering portion 303 of the first terminal 31A (or 31B) and the soldering portion 303 of the adjacent third terminal 33A (or 33B) is larger than a distance D1 between the contacting portion 301 of the first terminal 31A (or 31B) and the contacting portion 301 of the third terminal 33A (or 33B).

Reference is made to FIG. 4A to FIG. 4C. The printed circuit board 5 includes a plurality of plated through holes 50, and a plurality of grounding via holes 59. In this embodiment, the plated through holes 50 are corresponded with and electrically connected to the terminals 30 of the card edge connector in a soldered manner. However, the present disclosure is not limited thereto. For example, the terminals can be press-contact terminals, in which the bottom end of the terminal is pressed and contacted to corresponding pads on the printed circuit board 5. The grounding via holes 59 are not electrically conducted with the terminals of the card edge connector in a soldered manner, which are electrically connected by ground traces of the stacking structure of the printed circuit board 5. The plated through holes 50 are respectively located at two sides of an orthographic projection C of the elongated slot S of the card edge connector 2. The plated through holes 50 in one of the sides are arranged into a plurality of upper rows (U1, U2) parallel to each other and oblique to the longitudinal direction of the printed circuit board 5. The plated through holes 50 in the other side are arranged into a plurality of lower rows (L1, L2) parallel to each other and oblique to the longitudinal direction of the printed circuit board 5. The plated through holes 50 of the upper rows (U1, U2) and the plated through holes 50 of the lower rows (L1, L2) of the plated through holes 50 are not arranged on the same lines. The orthographic projection C of the elongated slot S onto the printed circuit board 5 is the same as the central line of the printed circuit board 5 along the longitudinal direction.

Reference is made in FIG. 4B. The plated through holes 50 includes a plurality of high-frequency signal holes 50s and a plurality of ground signal holes 50g. For ease of distinction, as shown in FIG. 4B and FIG. 4C, the high-frequency signal hole 50s are illustrated with dots on a periphery thereof, and peripheries of the ground signal holes 50g are left blank. Not all of the plated through holes are labeled one by one, and subsequent descriptions thereof should be considered accordingly.

Figure 4D:
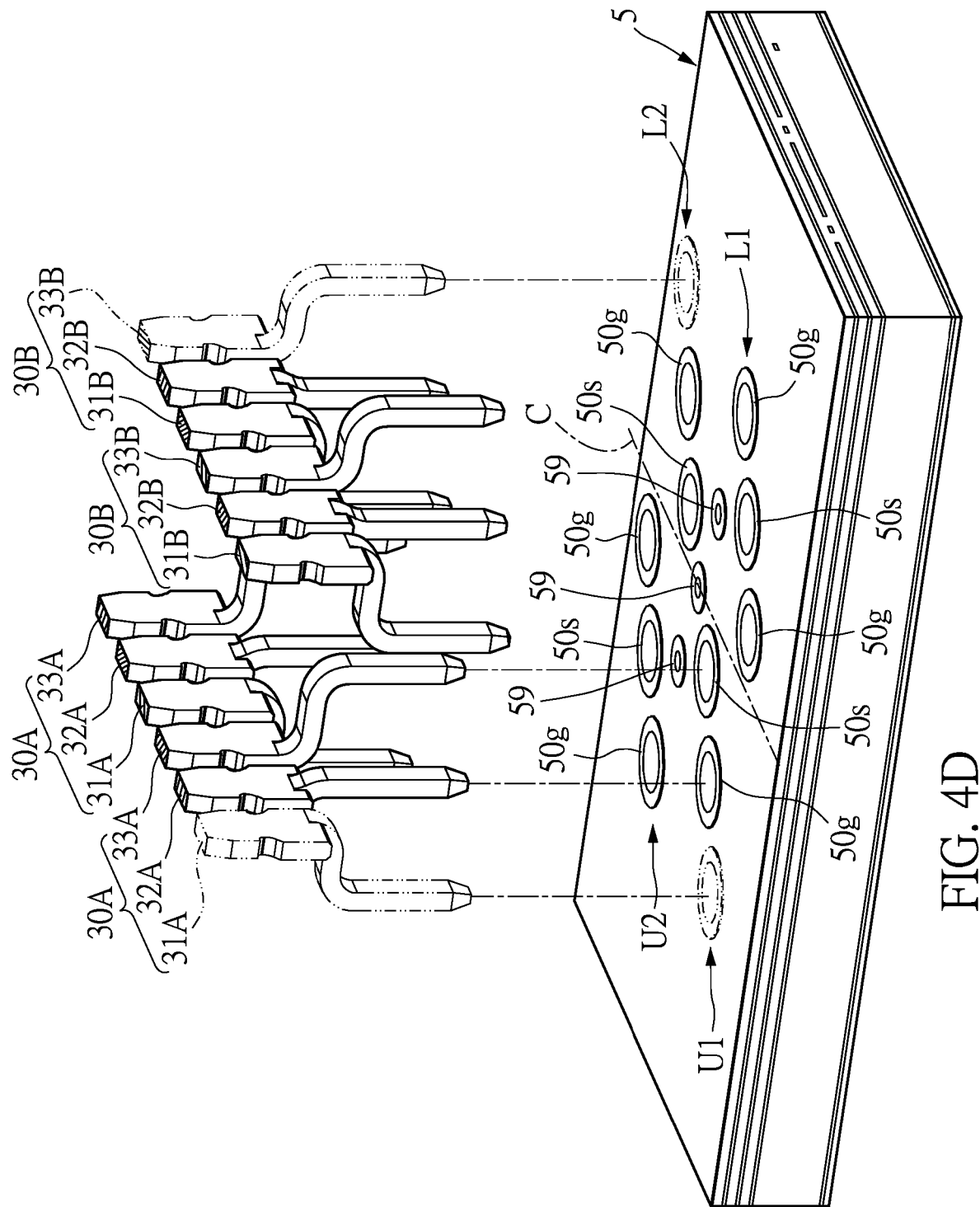
FIG. 4D is a perspective view of the terminal group and a part of the printed circuit board of the present disclosure.

Reference is made in FIG. 4B and FIG. 4D. According to FIG. 4B of this embodiment, above the central line C of the printed circuit board 5, the plated through holes from a left to right order are arranged into a first upper row, a second upper row, etc. Below the central line C, the plated through holes from the left to right order are arranged into a first lower row, a second lower row, etc. In the following description, two upper rows and two lower rows of the plated through holes are configured as one group in this embodiment.

The ground signal hole 50g at the first upper row U1 is correspondingly matched with the second terminal 32A of the upper-row terminal group 30A. The high-frequency signal hole 50s at the first upper row U1 adjacent to the orthographic projection C of the elongated slot S is correspondingly matched with the third terminal 33A of the upper-row terminal group 30A, and close to the ground signal hole 50g of the first upper row U1.

The first one of the ground signal hole 50g of the second upper row U2 adjacent to an outer edge of the printed circuit board 5 is correspondingly matched with the first terminal 31A of the upper-row terminal group 30A, and is close to the high-frequency signal hole 50s of the first upper row U1. The high-frequency signal hole 50s of the second upper row U2 is correspondingly matched with the second terminal 32A of the upper-row terminal group 30A, and is close to the first one of the ground signal hole 50g of the second upper row U2.

The second one of the ground signal hole 50g at the second upper row U2 adjacent to the orthographic projection C of the elongated slot S is correspondingly matched with the third terminal 33A of the upper-row terminal group 30A, and is close to of the high-frequency signal hole 50s of the second upper row U2.

Reference is made to FIG. 4B and FIG. 4D. The first one of the ground signal holes 50g of the first lower row L1 adjacent to the orthographic projection C of the elongated slot S, which is correspondingly matched with the first terminal 31B of the lower-row terminal group 30B. The high-frequency signal hole 50s at the first lower row L1 is correspondingly matched with the second terminal 32B of the lower-row terminal group 30B, and is close to the first one of the ground signal hole 50g of the first lower row L1. The second one of the ground signal hole 50g at the first lower row L1 is adjacent to the outer side of the printed circuit board 5, and is correspondingly matched with the third terminal 33B of the lower-row terminal group 30B.

The high-frequency signal holes 50s of the second lower row L2, which is adjacent to the orthographic projection C of the elongated slot S, is correspondingly matched with the first terminal 31B of the lower-row terminal group 30B, and is adjacent to the second one of the ground signal hole 50g of the first lower row L2. The ground signal hole 50g at the second lower row L2 is correspondingly matched with the second terminal 32B of the lower-row terminal group 30B, and is close to the high-frequency signal holes 50s of the second lower row L2.

In addition, the present disclosure arranges the plated through holes of two upper rows and two lower rows as one group. The uppermost of the plated through holes at the first upper row U1 can be, but are not limited to, high-frequency signal holes. The lowermost of the plated through holes at the second lower row L2 can also be, but are not limited to, high-frequency signal holes.

Referring to FIG. 4C, in this embodiment, a shortest distance d between the high-frequency signal hole 50s and the grounding via hole 59 is about 0.1 mm to 0.49 mm A distance H2 between the closest two of the high-frequency signal holes 50s at two sides of the grounding via holes 59, which is 1.35 mm in this embodiment, is larger than a distance D3 between two contacting portions 303 of the terminals 30, which is 0.85 mm in this embodiment. In detail, the grounding via holes 59 are formed within the orthographic projection C of the elongated slot 20 on the printed circuit board 5. The plated through holes 50 of upper rows and lower rows have a distance H1, which is 1.10 mm in this embodiment, being smaller than a thickness of the memory module card, which is 1.27±0.10 mm in this embodiment.

A distance between the high-frequency signal hole 50s of the first upper row U1 and the high-frequency signal hole 50s of the first lower row L1 has an orthogonal projection onto the longitudinal direction, which is defined as a first projection distance P1. A distance between the high-frequency signal hole 50s of the second upper row U2 and the high-frequency signal hole 50s of the second lower row L2 has an orthogonal projection onto the longitudinal direction, which is defined as a second projection distance P2. The first and second projection distances P1 and P2 are between 1.5 mm to 2.5 mm.

Figure 5A:
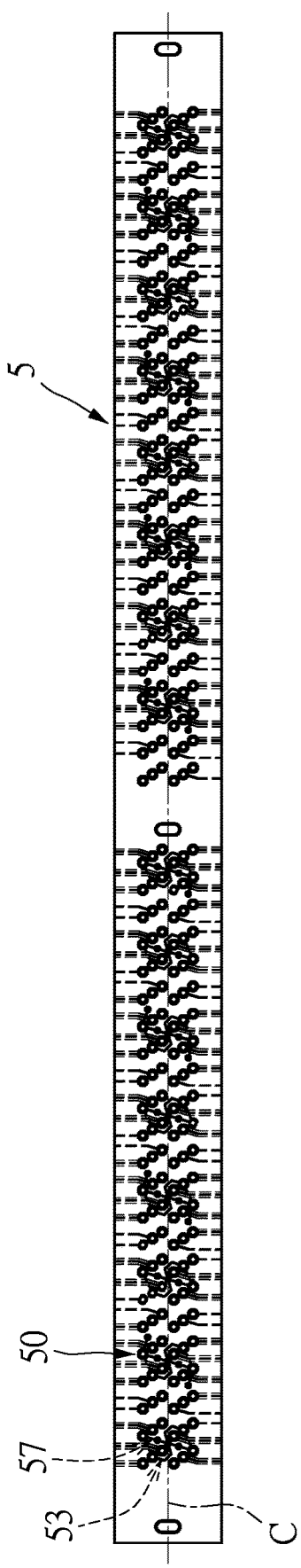
FIG. 5A is a schematic view of the printed circuit board of the present disclosure.
Figure 5B:
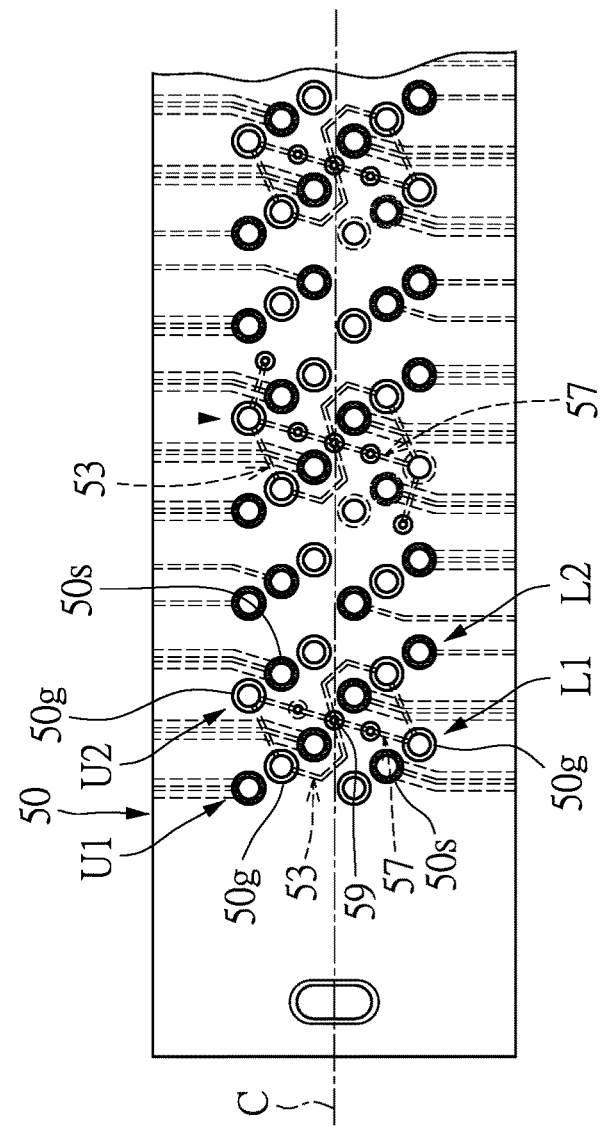
FIG. 5B is a partially enlarged schematic view of the printed circuit board of the present disclosure.

Reference is made to FIG. 5A to FIG. 5B. FIG. 5B is a transparent schematic view of the printed circuit board 5, which shows traces on an internal layer of the printed circuit board 5. At least three of the grounding via holes 59 are arranged in a straight line, and are not parallel to directions of the plated through holes 50 of upper rows or lower rows. In detail, if an included angle between the plated through holes 50 and the orthographic projection C of the elongated slot 20 is an acute angle, an included angle between the three of the grounding via holes 59 in a straight line and the orthographic projection C of the elongated slot 20 is an obtuse angle. Two sides of each of the grounding via holes 50g have one of the high-frequency signal holes 50s, respectively. In other words, the high-frequency signal hole 50s of the first upper row U1, the high-frequency signal hole 50s of the second upper row U2, and the high-frequency signal hole 50s of the second lower row L2 are separated by one of the grounding via holes 59. The high-frequency signal hole 50s of the first lower row L1 and the high-frequency signal hole 50s of the second lower row L2 are separated by one of the grounding via holes 59.

Referring to FIG. 5B, the middle one of the three grounding via holes 59 in a straight line is positioned in the orthographic projection C of the elongated slot 20 of the card edge connector 2. In this embodiment, three of the grounding via holes 59 in a straight line are interlinked by an internal grounding trace 57. The internal grounding trace 57 is extended outward to connect the ground signal hole 50g of the second upper row U2 and the ground signal hole 50g of the first lower row L1. In this embodiment, an internal winding grounding trace 53 connects the ground signal hole 50g of the second upper row and the ground signal hole 50g of the first upper row, and then is curved through the orthographic projection C of the elongated slot 20 to connect the middle one of the three grounding via holes 59. Then, the internal winding grounding trace 53 continues to curve downward to connect to the ground signal hole 50g of the second lower row, and finally connects to the ground signal hole 50g of the first lower row. In this embodiment, the internal winding grounding trace 53 and the internal grounding trace 57 are connected substantially in the shape of a figure eight. In detail, the internal winding grounding trace 53 is substantially S-shaped, and the internal grounding trace 57 is shaped in a straight line. Two ends of the internal winding grounding trace 53 are connected to two ends of the internal grounding trace 57, respectively. The figure eight configuration is divided into six spaces, each in which one of the high-frequency signal holes 50s is positioned, respectively. By such arrangement, the high-frequency signal holes 50s are all separated by the grounding traces (53, 57), so as to provide a good shielding effect for avoiding cross-talk interference. However, the grounding trace formed in the printed circuit board 5 is only a configuration in one of the exemplary embodiments, and the present disclosure is not limited thereto.

Figure 6:
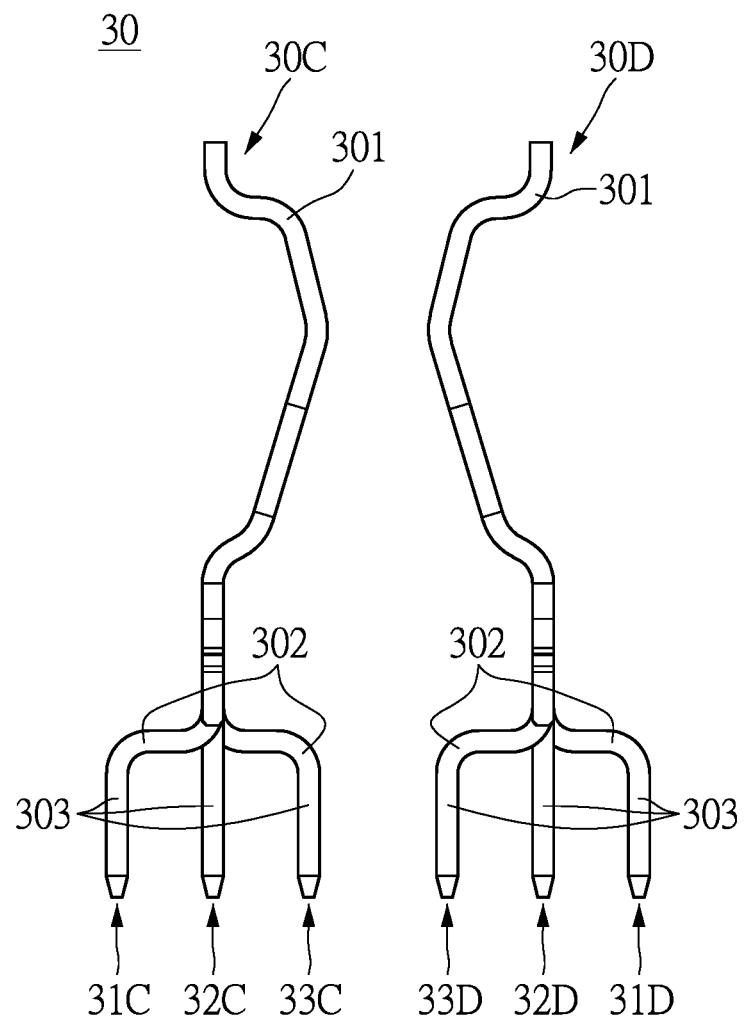
FIG. 6 is a side view of the terminal group according to a second embodiment of the present disclosure.

Referring to FIG. 6, which is a side view of the terminal group of another embodiment according to the present disclosure. The upper-row and lower-row terminal groups are not limited to the above embodiment. For example, in the terminals 30, the linking portions 302 of the second terminal 32C of the upper-row terminal group 30C, or of the second terminal 32D of the lower-row terminal group 30D, can extend directly downward from the bottom end of the contacting portion 301 without bending, and be coplanar with the soldering portion 303. The linking portion 302 of the first terminals (31C, 31D) and the linking portion 302 of the third terminals (33C, 33D) could be configured with an identical radius. In this embodiment, the distances between the soldering portions 303s of the upper-row terminal group 30C, and the soldering portions 303s of the lower-row terminal group 30D can be the same as the distances between the soldering portions 303 in the embodiment of FIG. 3B.

Figure 7:
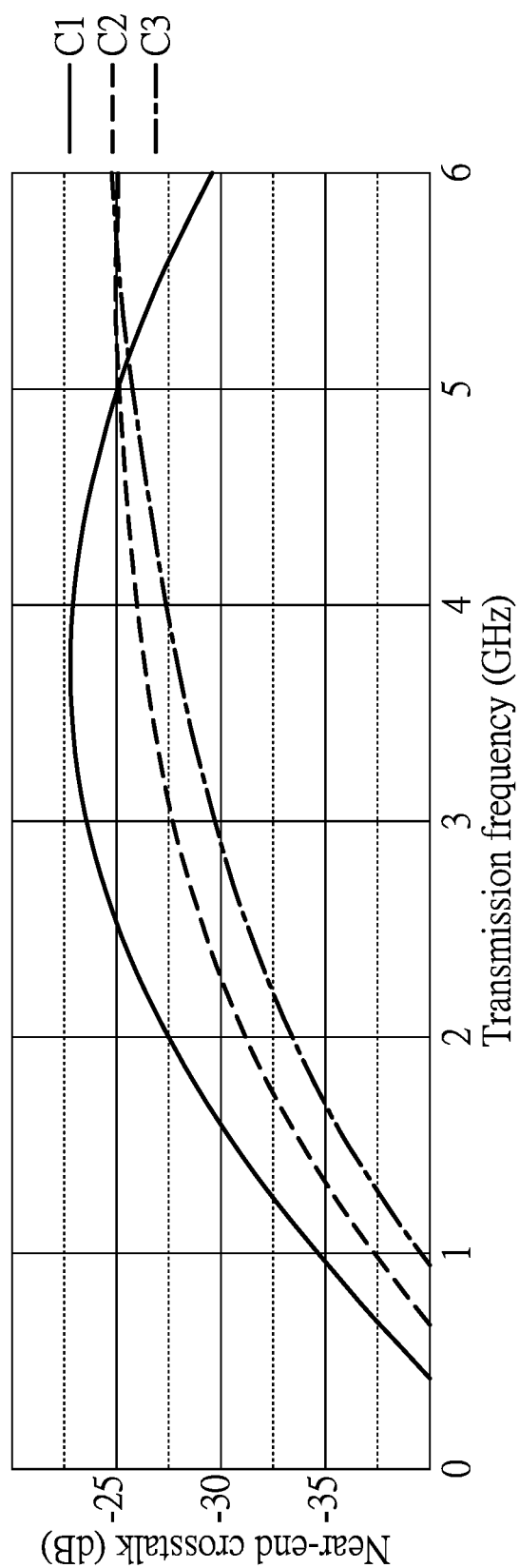
FIG. 7 is a curve diagram of a transmission frequency of the terminals and near-end crosstalk noises of the present disclosure.

Reference is made to FIG. 7, which is a curve diagram of a transmission frequency of the terminals and near-end crosstalk noises of the present disclosure. The horizontal axis (X-axis) in FIG. 7 indicates transmission frequency with a unit of GHz, and the vertical axis (Y-axis) indicates near end crosstalk with a unit of decibels (dB). Under a condition of a transmission frequency of under 5 GHz, the three curves from top to bottom respectively represent transmission performance curves C1, C2, and C3. Curve C1 is a traditional dual in-line packaged memory module card and the card edge connector. Curve C2 is the memory module card and the card edge connector with THT terminals according to the present disclosure. Curve C3 is the card edge connector with SMT (surface mounted technology) terminals according to the present disclosure. According to curve C2, it can be observed that the present disclosure has advantages as follows. The near end cross-talk of high-frequency signals is lower than −25 dB under a transmission frequency within a range of 0 GHz to 5 GHz, and the single channel transmission bandwidth can achieve a breakthrough of 51.2 GB/s, so as to provide a better shielding effect for high-frequency signal transmissions and enhance the capacity of channel transmission.

In conclusion, the present disclosure has advantages and functions as follows. Since the soldering portions of the terminals in the same group of the card edge connector extend toward the second terminal, when the second terminal is used to transmit ground signals, a better shielding effect for the high-frequency signal transmission can be provided. The high-frequency signal holes are isolated by ground traces or the grounding via holes, such that they can provide a good shielding effect for avoiding cross-talk interference. Further, the configuration of the card edge connector can allow for the increase of more high-frequency signal terminals, so as to adapt to a new memory module card of the next generation. The printed circuit board, on which the card edge connector is mounted, is also configured correspondingly, so that a DIMM (Dual In-line Memory Module) card edge connector of the present disclosure can be mass-produced, with a performance capable of matching with the DDR memory module card of the next generation.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An assembly of a printed circuit board and a card edge connector for interconnecting a memory module card, comprising:
   a card edge connector and a printed circuit board, wherein the card edge connector includes:
   an insulated housing having an elongated slot formed along a longitudinal direction and a key portion, wherein the key portion is arranged in the elongated slot, so as to divide the elongated slot into a first slot and a second slot, the insulated housing is formed with a plurality of terminal slots, and the terminal slots are respectively located at two sides of the elongated slot and extend perpendicular to the longitudinal direction; and
   a plurality of terminals that are correspondingly received in the terminal slots, wherein the terminals are divided into an upper-row terminal group and a lower-row terminal group, the upper-row terminal group is received in the terminal slots arranged at one side of the longitudinal direction, and the lower-row terminal group is received in the terminal slots arranged at the other side of the longitudinal direction;
   wherein the upper-row terminal group and the lower-row terminal group respectively include a first terminal, a second terminal and a third terminal, each of the terminals has a contacting portion, a soldering portion and a linking portion, and the linking portion interconnects the contacting portion and the soldering portion;
   wherein the linking portion of the first terminal extends toward a direction perpendicular to the longitudinal direction and is bent toward the same direction, the linking portion of the third terminal is bent toward a direction opposite to the bending direction of the linking portion of the first terminal;

wherein the linking portion of the second terminal is disposed adjacent to and between the linking portion of the first terminal and the linking portion of the third terminal;

wherein a distance between the contacting portion of the first terminal and the contacting portion of the second terminal is equal to a distance between the contacting portion of the second terminal and the contacting portion of the third terminal, said distance is larger than a distance between the soldering portion of the first terminal and the soldering portion of the second terminal, and is larger than a distance between the soldering portion of the second terminal and the soldering portion of the third terminal;

wherein the printed circuit board includes a plurality of plated through holes and a plurality of grounding via holes, the plated through holes are respectively located at two sides of an orthographic projection of the elongated slot, the plated through holes are arranged into a plurality of upper rows on one side and a plurality of lower rows on the other side, the upper rows and the lower rows are oblique to the longitudinal direction of the printed circuit board;

wherein the plated through holes include a plurality of ground signal holes and a plurality of high-frequency signal holes, which are configured as follows:

the ground signal hole of a first upper row being correspondingly matched with the second terminal of the upper-row terminal group;

the high-frequency signal hole of the first upper row being adjacent to an orthographic projection of the elongated slot and correspondingly matched with the third terminal of the upper-row terminal group, and being close to the ground signal hole of the first upper row;

a first one of the ground signal holes of a second upper row being correspondingly matched with the first terminal of the upper-row terminal group, and being adjacent to the high-frequency signal hole of the first upper row;

the high-frequency signal hole of the second upper row being correspondingly matched with the second terminal of the upper-row terminal group, and being close to first one of the ground signal holes of the second upper row;

a second one of the ground signal holes of the second upper row being adjacent to the orthographic projection of the elongated slot and correspondingly matched with the third terminal of the upper-row terminal group, and being close to the high-frequency signal hole of the second upper row;

a first one of the ground signal holes of a first lower row being adjacent to the orthographic projection of the elongated slot and correspondingly matched with the first terminal of the lower-row terminal group;

the high-frequency signal hole of the first lower row being correspondingly matched with the second terminal of the lower-row terminal group, and being close to a first one of the ground signal holes of the first lower row;

the ground signal hole of a second lower row being correspondingly matched with the second terminal of the lower-row terminal group, and is close to the high-frequency signal hole of the first lower row;

a second one of the ground signal holes of the first lower row being adjacent to an outer side of the printed circuit board and being correspondingly matched with the third terminal of the lower-row terminal group;

the high-frequency signal hole of the second lower row being adjacent to the orthographic projection of the elongated slot and correspondingly matched with the first terminal of the lower-row terminal group, and being adjacent to the second one of the ground signal holes of the first lower row;

the ground signal hole of the second lower row being correspondingly matched with the second terminal of the lower-row terminal group, and being adjacent to the high-frequency signal hole of the second lower row;

wherein the high-frequency signal hole of the first upper row, the high-frequency signal hole of the second upper row, and the high-frequency signal hole of the second lower row are separated by one of the grounding via holes; wherein the high-frequency signal hole of the first lower row and the high-frequency signal hole of the second lower row are separated by one of the grounding via holes.

2. The assembly of the printed circuit board and the card edge connector according to claim 1, wherein a shortest distance between the high-frequency signal hole and the grounding via hole is about 0.1 mm to 0.49 mm.

3. The assembly of the printed circuit board and the card edge connector according to claim 1, wherein a distance between the high-frequency signal hole of the first upper row and the high-frequency signal hole of the first lower row has an orthogonal projection onto the longitudinal direction which is defined as a first projection distance, wherein a distance between the high-frequency signal hole of the second upper row and the high-frequency signal hole of the second lower row has an orthogonal projection onto the longitudinal direction which is defined as a second projection distance, and the first and second projection distances are between 1.5 mm to 2.5 mm.

4. The assembly of the printed circuit board and the card edge connector according to claim 1, wherein a radius of the linking portion of the second terminal is smaller than a radius of the linking portion of the first terminal, and is also smaller than a radius of the linking portion of the third terminal.

5. The assembly of the printed circuit board and the card edge connector according to claim 1, wherein the linking portion of the second terminal extends directly from a bottom end of the contacting portion without bending, and is coplanar with the soldering portion.

6. The assembly of the printed circuit board and the card edge connector according to claim 1, wherein in the same group of the terminals, a pitch between the soldering portions of the terminals for transmitting high-frequency signal is larger than a pitch between the soldering portions of the terminals for grounding, such that the near end cross-talk of high-frequency signals is lower than −25 dB under a transmission frequency within a range of 0 GHz to 5 GHz.

7. The assembly of the printed circuit board and the card edge connector according to claim 1, wherein a profile of the first terminal of the upper-row terminal group is the same as a profile of the third terminal of the lower-row terminal group, and a profile of the third terminal of the upper-row terminal group is the same as a profile of the first terminal of the lower-row terminal group.

8. The assembly of the printed circuit board and the card edge connector according to claim 1, wherein for the upper-row terminal group or the lower-row terminal group, a distance between the soldering portion of the first terminal and the soldering portion of the adjacent third terminal is larger than a distance between the contacting portion of the first terminal and the contacting portion of the third terminal.

9. The assembly of the printed circuit board and the card edge connector according to claim 1, wherein two sides of each of the grounding via holes have one of the high-frequency signal holes, respectively.

10. The assembly of the printed circuit board and the card edge connector according to claim 1, wherein at least three of the grounding via holes are arranged in a straight line, which is not parallel to a direction of the plated through holes of the upper rows, and not parallel to a direction of the plated through holes of the lower rows.

11. The assembly of the printed circuit board and the card edge connector according to claim 10, wherein the printed circuit board further includes an internal grounding trace formed therein, three of the grounding via holes in a straight line are interlinked by the internal grounding trace, and the middle one of the three grounding via holes in a straight line is positioned in the orthographic projection of the elongated slot of the card edge connector; and the internal grounding trace is extended outward to connect with the ground signal hole of the second upper row and the ground signal hole of the first lower row.

12. The assembly of the printed circuit board and the card edge connector according to claim 11, wherein the printed circuit board further includes an internal winding grounding trace, the internal winding grounding trace is substantially S-shaped, the internal grounding trace is shaped in a straight line, and two ends of the internal winding grounding trace are respectively connected to two ends of the internal grounding trace;

wherein the internal winding grounding trace connects to the ground signal hole of the second upper row, the ground signal hole of the first upper row, and curves through the orthographic projection of the elongated slot to connect the middle one of the three grounding via holes, continues to curve toward the ground signal hole of the second lower row, and finally connects to the ground signal hole of the first lower row, so as to form the shape of an S.

* * * * *